United States Patent
Ho et al.

(10) Patent No.: US 9,703,918 B2
(45) Date of Patent: Jul. 11, 2017

(54) TWO-DIMENSIONAL PROCESS WINDOW IMPROVEMENT

(71) Applicant: Taiwan Semiconductor Manufacturing Company, Ltd., Hsin-Chu (TW)

(72) Inventors: Wei-De Ho, Hsinchu (TW); Chi-Yuan Sun, New Taipei (TW); Ya Hui Chang, Hsinchu (TW); Hung-Chang Hsieh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 72 days.

(21) Appl. No.: 14/658,947

(22) Filed: Mar. 16, 2015

(65) Prior Publication Data
US 2016/0274455 A1    Sep. 22, 2016

(51) Int. Cl.
*G03F 1/36* (2012.01)
*G03F 1/44* (2012.01)
*G06F 17/50* (2006.01)

(52) U.S. Cl.
CPC ............ *G06F 17/5081* (2013.01); *G03F 1/36* (2013.01)

(58) Field of Classification Search
CPC .................. G03F 1/36; G03F 1/42; G03F 1/44
USPC ............................................................ 430/5
See application file for complete search history.

(56) References Cited

U.S. PATENT DOCUMENTS

| | | | |
|---|---|---|---|
| 7,479,355 B1* | 1/2009 | Chen | G03F 1/144 430/322 |
| 8,039,179 B2 | 10/2011 | Shieh et al. | |
| 8,202,681 B2 | 6/2012 | Lin et al. | |
| 8,728,332 B2 | 5/2014 | Lin et al. | |
| 8,822,243 B2 | 9/2014 | Yan et al. | |
| 2006/0091468 A1 | 5/2006 | Liaw | |
| 2007/0128525 A1* | 6/2007 | Wallace | G03F 1/144 430/5 |
| 2011/0281208 A1 | 11/2011 | Lin et al. | |
| 2012/0278776 A1 | 11/2012 | Lei et al. | |
| 2013/0295769 A1 | 11/2013 | Lin et al. | |
| 2013/0320451 A1 | 12/2013 | Liu et al. | |
| 2014/0193974 A1 | 7/2014 | Lee et al. | |
| 2014/0215421 A1 | 7/2014 | Chen et al. | |
| 2014/0242794 A1 | 8/2014 | Lin et al. | |

(Continued)

*Primary Examiner* — Stephen Rosasco
(74) *Attorney, Agent, or Firm* — Haynes and Boone, LLP

(57) ABSTRACT

A method of optimizing a semiconductor mask layout is provided. The method includes accessing a digital file comprising the semiconductor mask layout, accessing processing condition parameters describing process conditions, receiving a request from a user of a mask layout system to initiate a semiconductor mask layout optimization process, applying a set of rules to insert an array of assist features into the semiconductor mask layout, and updating the digital file. The semiconductor mask layout includes a plurality of parallel mask features, wherein pairs of the parallel mask features share an end-to-end region between the parallel mask features of each pair, with an imaginary axis bisecting the end-to-end regions. Each assist feature is located proximate to at least one end-to-end region, and the imaginary axis intersects each assist feature. Related photomasks, design layout systems, and computer-readable media are also provided.

20 Claims, 8 Drawing Sheets

(56) References Cited

U.S. PATENT DOCUMENTS

2014/0264760 A1 9/2014 Chang et al.
2014/0264899 A1 9/2014 Chang et al.
2014/0273442 A1 9/2014 Liu et al.
2014/0273446 A1 9/2014 Huang et al.

* cited by examiner

TWO-DIMENSIONAL PROCESS WINDOW IMPROVEMENT

BACKGROUND

A semiconductor wafer is processed by a semiconductor manufacturer to form various integrated circuits (IC) in different regions of the wafer. Variations in pattern density over the different regions can cause various issues including critical dimension (CD) variation or CD uniformity. When the semiconductor fabrication scales down to increasingly advanced technology nodes, such as 45 nm, 32 nm, or 28 nm, the IC features are more sensitive to CD variations and uniformity. For example, dense lines and isolated lines are common in IC layout and cannot be avoided by the design rules. However, as the feature size decreases, high fidelity replication of such mask features into an underlying material layer can be problematic. Additionally, as the technologies have advance, some currently used approaches may have limited effectiveness and applicability. Therefore, there is a need of a masks and methods to address such issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
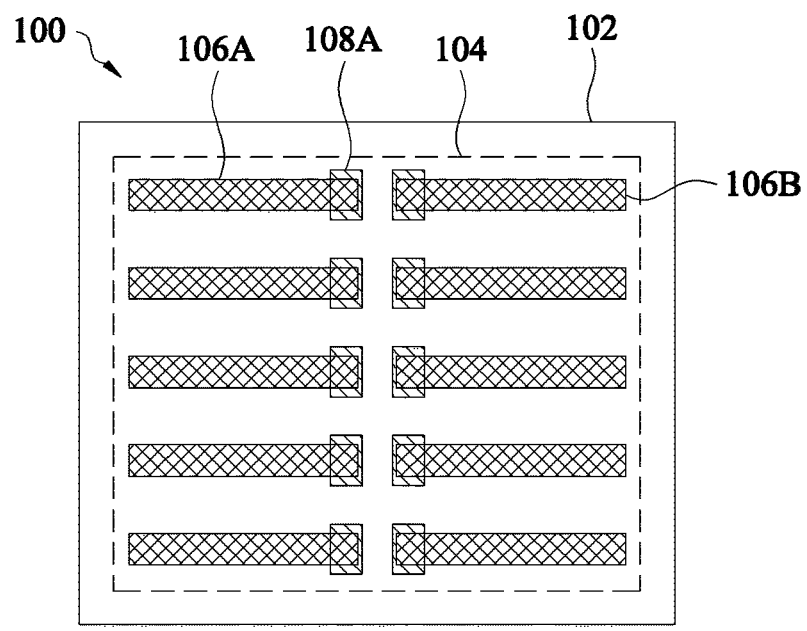
FIG. 1A is a top view of an embodiment of a semiconductor mask layout including a two-dimensional array of parallel mask features.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing steps and/or features of a device may be only briefly described, such steps and/or features being well known to those of ordinary skill in the art. Also, additional processing steps or features can be added and certain of the following processing steps or features can be removed and/or changed while still implementing the claims. Thus, the following description should be understood to represent examples only, and are not intended to suggest that one or more steps or features is required.

It is further understood that the present disclosure refers generally to photolithography processing. Various embodiments are provided herein for a photomask, for a method of improving a semiconductor mask layout, and a system that may be used in associated layout optimization. Furthermore, specific embodiments may be described herein which are exemplary only and not intended to be limiting.

Referring now to FIG. 1, illustrated is a portion of a semiconductor design layout 100, also referred to herein as a design layout 100. The design layout 100 may be a data file and may be presented in formats including GDSII, DFII, and/or other files formats. Thus, the design layout 100 may be expressed in a file format readable by mask layout and/or mask data preparation tools operable to form photomasks or deliver formatted data and instructions to writer tools such as, e-beam lithography tools. The design layout 100 may include multiple layers, with each layer being associated with one or more material layers to be patterned during a semiconductor fabrication process or the design layout 100 may include a single layer associated with a single material layer. As shown in FIG. 1A, the design layout 100 is a layout for the patterning of a single material layer, such as a radio-opaque material layer, deposited on a radio-transparent or partially radio-transparent mask substrate to form a photomask. For example, a photomask formed with a chrome layer over a quartz substrate, according to the design layout 100, may be used in an extreme ultraviolet lithography, a process in which the radiation or light source produced light having a wavelength of about or less than 200 nanometers, or another lithography process to pattern a photoresist layer on a semiconductor substrate during a device fabrication process. Only a portion of the design layout 100 may be seen in FIG. 1A.

In the depicted portion, the design layout 100 has several mask design features including a two-dimensional array 104 of parallel mask features on a background 102, such as the exemplary parallel mask design features 106A and 106B. As illustrated in FIG. 1A, the design layout 100 includes a two-by-five two-dimensional array that includes five pairs of parallel mask design features, which are design layout features for a photomask. The design features 106A and 106B, etc., may be represented in layout data as polygons having coordinates and/or dimensions. One such pair includes parallel mask design features 106A and 106B, which are arranged together such that an end-to-end region is present between them. As the size of the smallest feature to be realized according to the design layout 100 decreases, the fidelity of the transfer of the design into an underlying photoresist layer may degrade. In effort to improve the fidelity of photoresist layers patterned using the design layout 100, the design layout 100 may include features generated according to certain resolution enhancement techniques. In particular, the design layout 100 includes certain optical proximity correction features located on each of the parallel mask design features in the array 104, where each pair forms an end-to-end region. Thus, the enhancement design feature 108A is positioned over the parallel mask design feature 106A at the end nearest the parallel mask design feature 106B. Similarly, the enhancement design feature 108B is positioned over the parallel mask design feature 106B at the end nearest the parallel mask design feature 106B. In the design layout 100, the enhancement design features 108A and 108B may be included on a layer that is separate from the layer including the array 106 of parallel mask design features. Thus, when editing a file including the mask or design layout 100, each layer may be manipulated separately. However, both the array 104 and the enhancement design features 108A and 108B are to be included in photomasks made according to the design layout 100.

The enhancement design features 108A and 108B may be added manually by a layout designer using a mask layout design environment on a computing system. In some embodiments, the enhancement design features 108A and 108B may be added by a system or service, such as layout optimization service provided by the mask layout design environment without any affirmative operator action. As illustrated, the enhancement design features 108A and 108B are intended to increase the fidelity of transfer of the parallel mask design features of the array 104 by improving the transfer at the end-to-end regions.

Figure 1B:
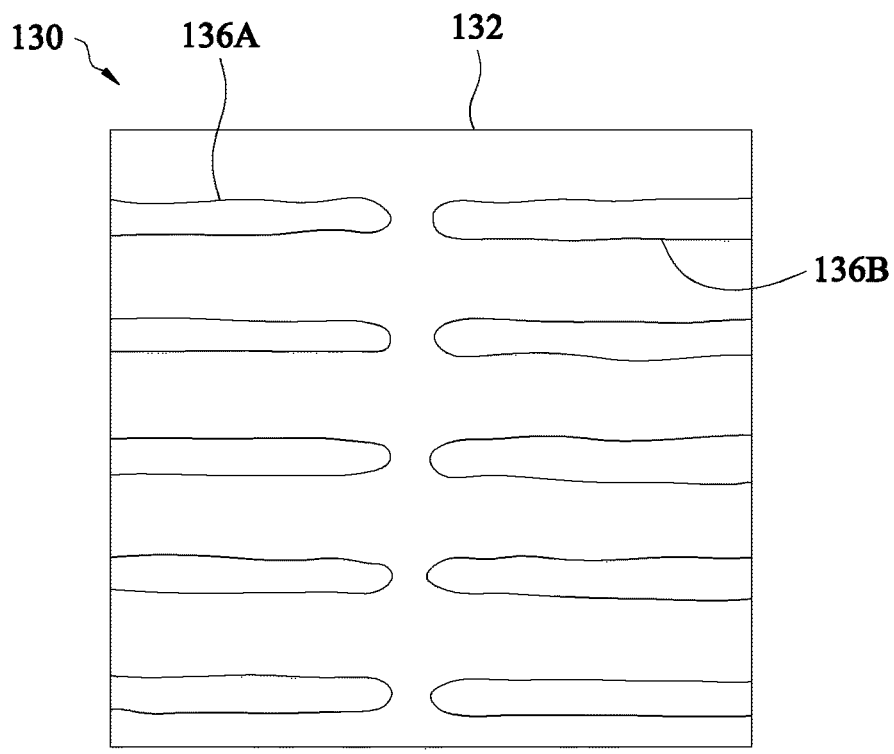
FIG. 1B is a top view of a simulated photomask created using the semiconductor mask layout of FIG. 1A.

Referring now to FIG. 1B, shown therein is an exemplary diagram of a patterned wafer 130. The patterned wafer 130 depicts an example of a wafer patterned using a photomask created from the design layout 100 of FIG. 1A. As shown in FIG. 1B, the patterned wafer includes a substrate 132 with a patterned photoresist layer thereon. The patterned photoresist layer includes a resist feature 136A and a resist feature 136B. The resist features 136A and 136B correspond to the parallel mask design features 106A and 106B as seen in the design layout 100 of FIG. 1B. As seen in FIG. 1B, there is significant rounding-off or tapering at the ends of the resist features 136A and 136B that border the end-to-end region between each pair. This tapering may cause any features patterned using the resist features 136A and 136B to exhibit even less fidelity to the design layout 100. Additionally, the photoresist feature tapering illustrated in FIG. 1B may result in greater than desired spacing between the photoresist features. E.g., distance between the resist features 136A and 136B may be significantly greater than the distance between the parallel mask features 136A and 138B and/or the enhancement design features 108A and 108B. This may degrade the performance of devices such as transistors, like MOSFETs, or other functional structures.

Figure 2A:
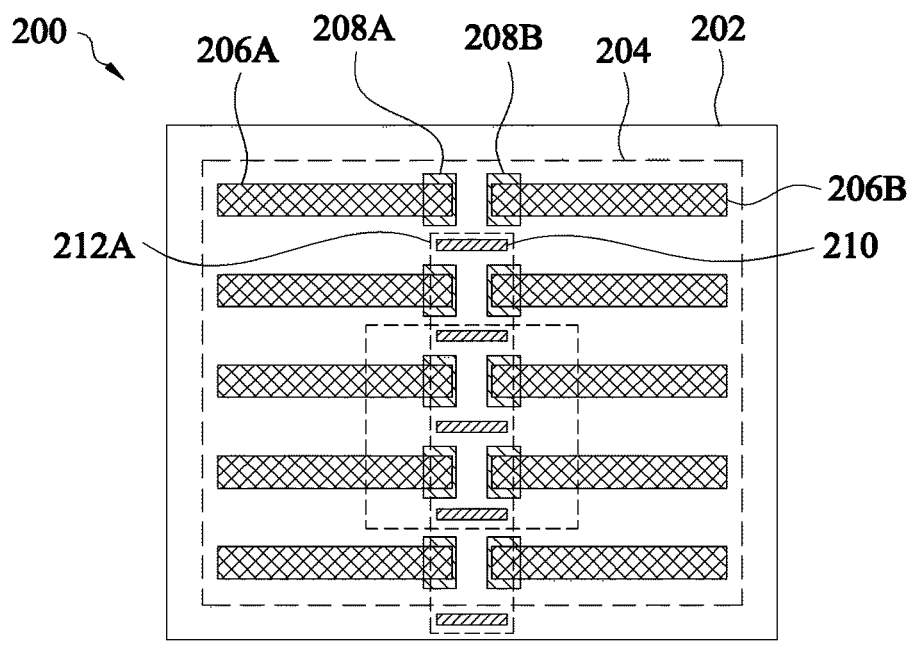
FIG. 2A is a top view of an embodiment of a semiconductor mask layout including a two-dimensional array of parallel mask features according to aspects of the present disclosure.

FIG. 2A illustrated a design layout 200 that is similar in many respects to the design layout 100 of FIG. 1A. Thus, the design layout 200 as seen in FIG. 2A has a portion 202 with a two-dimensional array 204 of parallel design features, such as exemplary parallel design features 206A and 206B. The exemplary parallel design features 206A and 206B are separate by a narrow end-to-end region, which may be difficult to transfer with high fidelity into the photoresist layer. Also like the design layout 100, the design layout 200 includes enhancement design features, such as the enhancement design features 208A and 208B.

The design layout 200 includes a one-dimensional array 210 of assist features, including the exemplary assist feature 212A. As shown in FIG. 2A, the assist features of the one-dimensional array 210 are design features, which may be represented as polygons in design layout data. As illustrated the assist feature 212A is a narrow rectangle that borders one side of the end-to-end region formed between the parallel design features 206A and 206B. The assist feature 212A may be of such dimensions that, when present in a photomask according to the design layout 200, the assist feature is not transferred into any underlying photoresist layers. Thus, the assist feature 212A may be a sub-resolution assist feature when patterned in a photomask. The assist feature 212A is not included in the design layout 200 to be patterned into a photoresist layer, but rather the assist feature 212A may improve the transfer of the parallel design features 206A and 206B as seen in FIG. 2B.

Figure 2B:
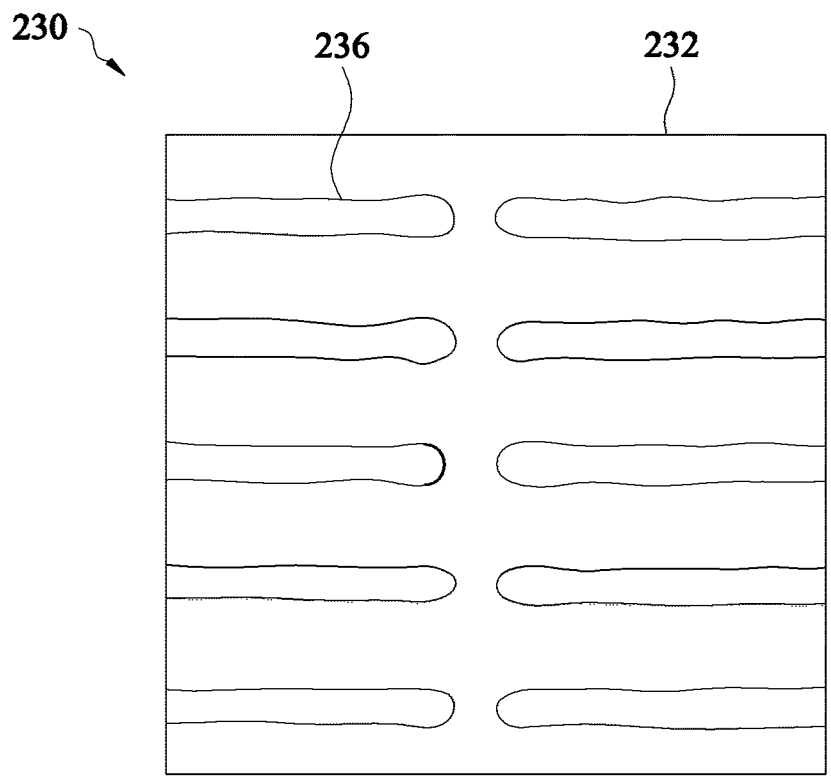
FIG. 2B is a top view of a simulated photomask created using the semiconductor mask layout of FIG. 2A according to aspects of the present disclosure.

FIG. 2B is an exemplary illustration of a wafer 230 that has been patterned with a photomask according to the design layout 200. Thus, the photomask used to pattern the wafer 230 may include a one-dimension array of mask features corresponding to the one-dimensional array 210 of assist features, like the assist feature 212A. As seen in FIG. 2B, the photomask assist features corresponding to the one-dimensional array 210 are not transferred into the photoresist layer 236 located over the substrate 232.

In one example, the substrate 232 is a silicon substrate. The substrates may alternatively or additionally include other elementary semiconductors, such as germanium. The substrates may also include a compound semiconductor, such as silicon carbide, gallium arsenic, indium arsenide, and indium phosphide. Alternatively, the substrates may include a non-semiconductor material such as glass, quartz, calcium fluoride, and/or other suitable material. The substrate 232 may include a plurality of features formed thereon providing a semiconductor device or portion thereof, MEMS device or portion thereof, and/or other suitable feature. Thus, the photoresist layer 236 may be formed directly over the substrate 232 or over the substrate 232 while directly in contact with another material layer that is formed over the substrate. For example, layers formed over the substrate, which the photoresist layer 236 may contact, may include a layer or layers of silicon oxide, silicon nitride, polysilicon, epitaxially-grown silicon, various metals, etc. Regardless of the layer directly underlying the photoresist layer 236, the photoresist layer 236 may be used to pattern such an underlying layer.

As seen in FIG. 2B, the addition of the one-dimensional array 210 of assist features to the photomask improved the fidelity of transfer of the design layout 100 into the photoresist layer 236. The tapering present in FIG. 1B is largely mitigated in FIG. 2B. Additionally, the end-to-end region is dimensioned more closely to the design layout 200. This may improve device performance and/or device yield on wafers processed using the design layout 200 as compared to wafers processed using the design layout 100.

Figure 2C:
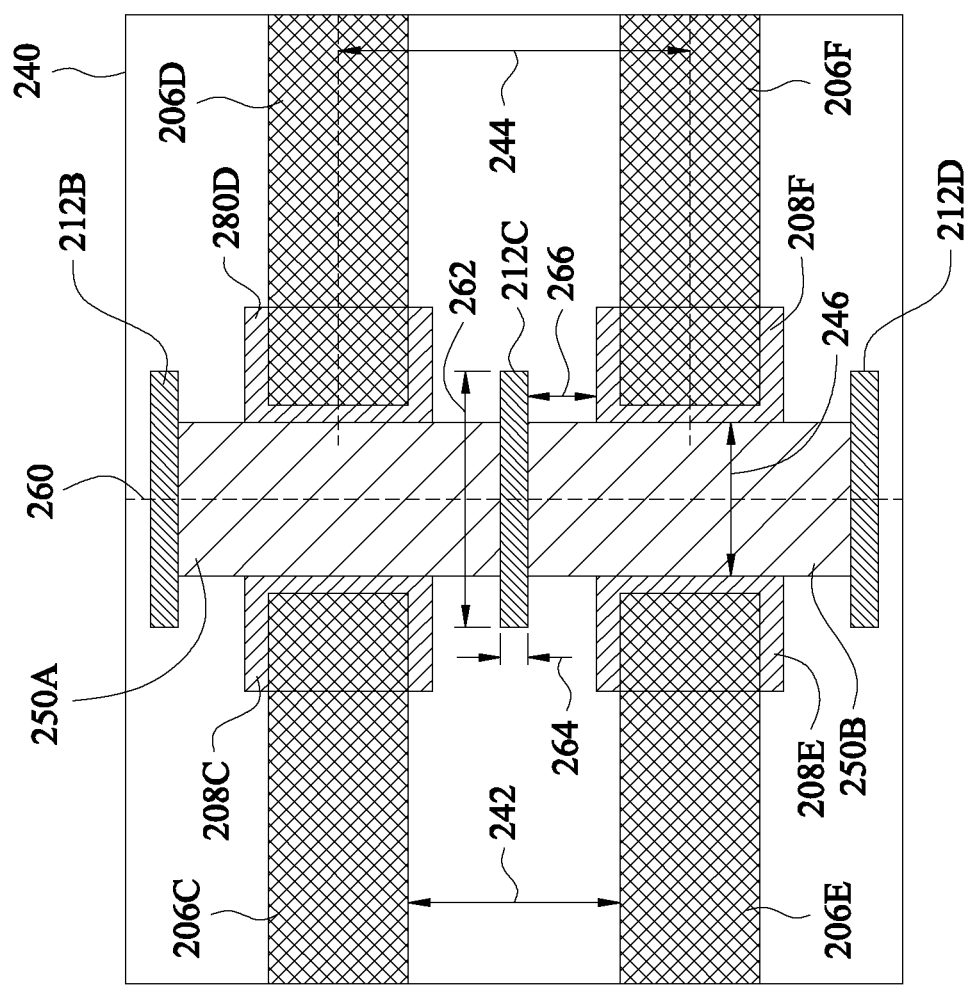
FIG. 2C is a close-up, top view of the semiconductor mask layout of FIG. 2A according to aspects of the present disclosure.

Referring now to FIG. 2C, shown therein is a close-up view of the design layout 200 as seen according to the window 240 of FIG. 2A. The close-up view may provide additional information regarding the design layout 200. As illustrated in window 240, the design layout 200 includes parallel design features 206C, 206D, 206E, and 206F. Window 240 also illustrates line-end enhancement design features 208C, 208D, 208E, and 208F. As shown in FIG. 3, the enhancement design features 212C-F may extend beyond the parallel design features 206C-F. The parallel design features 206C-F may be described in terms of a spacing value which describes the spacing 242 between the design features 206C and 206E (or between the design features 206D and 206F), or the spacing in the direction other than the pairing direction. A pitch value may be used to describe the pitch 244, i.e., mid-point to mid-point distance, between the design features 206D and 206F (or between the design features 206C and 206E). Also an end-to-end spacing value may describe an end-to-end spacing 246 between the enhancement design features 208C and 208D as shown, or in other embodiments, to describe the distance between the end of the design feature 208D and the design feature 206D, depending on the implementation of the enhancement design features 208C-F.

Also illustrated in the design layout 200 as seen in FIG. 2C, are three assist features of the one-dimensional array 210. Together with the enhancement design features 208C-F, the assist features 212B, 212C, and 212D define two end-to-end regions. The first end-to-end region 250A is bounded by the enhancement design feature 208C, the assist feature 212B, the enhancement design feature 208D, and the assist feature 212C. The second end-to-end region 250B is bounded by the enhancement design features 208E, the assist feature 212C, the enhancement design feature 208F, and the assist feature 212D.

To convey spatial and geometric relationships between some of the illustrated features of the design layout 200, an imaginary axis 260 is included. The imaginary axis intersects all of the assist features 212B-D. As illustrated, the imaginary axis 260 bisects each of the assist features 212B-D, aligning them with the end-to-end regions 250A and 250B, which are also bisects by the imaginary axis 260. In some embodiments, the assist features 212B-D may be offset, such that, while intersected by the imaginary axis 260, not all of the assist features 212B-D are bisected.

The assist features 212B-212D may all have the same dimensions. As shown in FIG. 2C, the assist feature 212C includes a length 262, a width 264, and a spacing 266 that describes a separation distance between the assist feature 212C and the enhancement design feature 208F. In some embodiments, the spacing 266 may also describe the separation distances between the assist feature and the enhancement design feature 208C, the enhancement design feature 208D, and the enhancement design feature 208E. While the dimensions of the assist features 212A-D in the one-dimensional array 210 may vary, in some embodiments, the width ranges from about 6 nanometers to about 20 nanometers, the length ranges from about 50 nanometers to about 200 nanometers, and the spacing ranges from about 40 nanometers to about 90 nanometers.

The assist features of the one-dimensional array 210 may be included automatically during an optimization process performed on some of the layers of the design layout 200. For example, in some embodiments, a preference or setting is checked in a design layout system. If the preference or setting indicates that the inclusion of a one-dimensional array like the one-dimensional array 210 is requested, the design layout system may check certain conditions. If the conditions are suitable, the design layout system may then add the array 210. In some embodiments, the conditions may include requirements as to the material layer to be patterned by the photomask based on the design layout 200, the process (e.g., wet etch, dry etch, physical and/or chemical etch mechanisms used) use to pattern the material layer, the wavelength of the light source (e.g., ultraviolet, extreme ultraviolet, etc.), the type of light source or illumination pattern (e.g., dipole, annular, circular, etc.), and/or pattern geometries including the pitch, the end-to-end spacing, and the spacing between the parallel design features. The design layout system may derive at least some of these process conditions from information contained in the data file including the design layout 200.

For example, the design layout system identify a two-dimensional array in the layout data and may extract a pitch value from the data file and check to see whether the pitch value of the photomask patterned according to the design layout 200 is below a predetermined threshold, such as below 90 nanometers. Another condition may be that the parallel design feature spacing is in a range from about 40 nanometers to about 80 nanometers. In some embodiments, the end-to-end spacing value may be informed by the design layout 200 and also by measurements of photomasks created using the design layout 200. Thus, some of the values may be after-development inspection values obtained from actual photomasks.

In some embodiments, the values for the pitch, the end-to-end spacing, and the parallel design feature separation may be ratios of measurements in nanometers to the desired source wavelength in nanometers. For example, one condition may be that the array 210 is not added by the design system when the end-to-end spacing value is greater than 0.23 times the light source wavelength, which may be about 200 nanometers. Expressed differently, the design layout system may check to see that the end-to-end spacing value is less than about 0.23 times the light source wavelength. Other threshold values may be used in other embodiments. As another example, the design layout system may check to ensure that the parallel design feature separation value is within a range from about 0.2 times the light source wavelength to about 0.4 times the light source wavelength. The system may further check a light source type indicator to determine that dipole illumination is to be used. If all of these conditions are met, the design layout system may add the array 210 to the two-dimensional array 204. In some embodiments, a margin by which a given condition is met (e.g. how much smaller the end-to-end spacing value is that 0.23 times the light source wavelength) may be calculated and the margins may be assessed to see if an array 210 may be added to a design layout 200 that does not meet every other condition.

In adding the array 210 to the main pattern of the two-dimensional array 204, the design layout system may check to see whether there are any assist features are present in the end-to-end regions, between the pairs of parallel design features. If features are present, the design layout system may remove them so that, after addition of the array 210, there are no assist features within the end-to-end regions or between the pairs of parallel design features. The inclusion of array 210 includes assist features between end-to-end regions or bordering an end-to-end region.

Figure 3A:
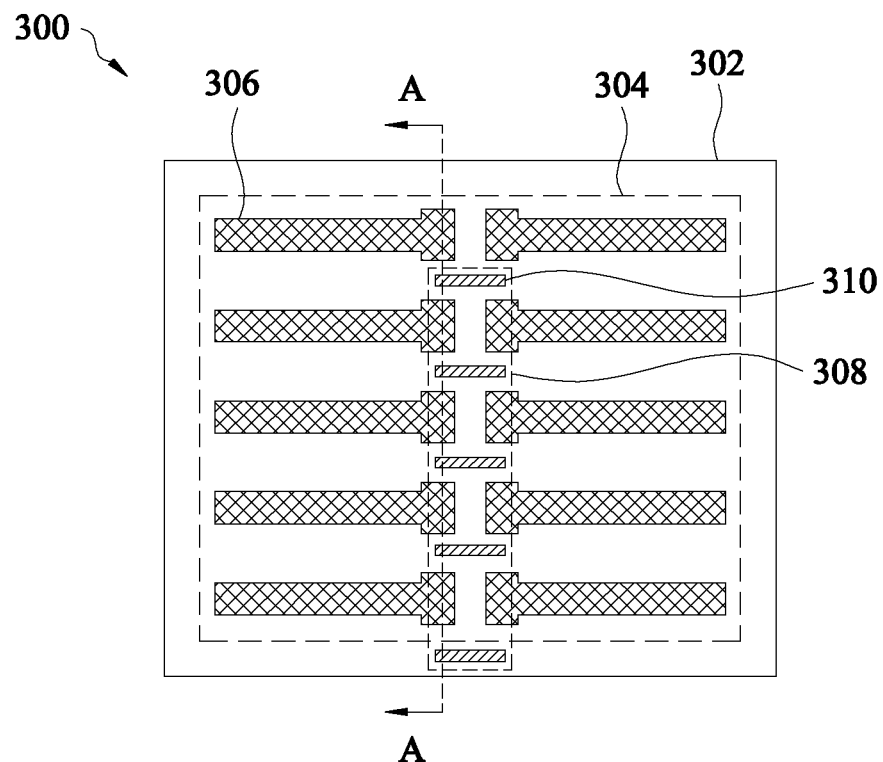
FIG. 3A is a top view of a portion of a photomask according to the semiconductor mask layout of FIG. 2A and according to aspects of the present disclosure.
Figure 3B:
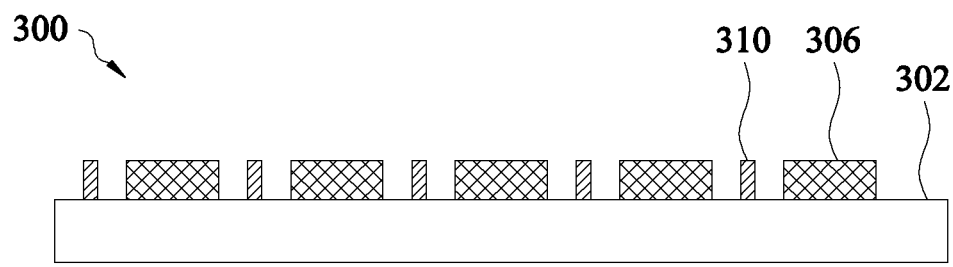
FIG. 3B is a cross-sectional, side view of the portion of the photomask of FIG. 3A as seen along line A-A thereof, according to aspects of the present disclosure.

Referring now to FIGS. 3A and 3B, shown therein are exemplary portions of a photomask 300 created according to the design layout 200 as seen in FIGS. 2A, 2B, and 2C. The photomask 300 includes a substrate 302. This substrate 302 may be similar to the substrate 232 of FIG. 2B, described above. On the substrate 300 is two-dimensional array 304 of main pattern features, like the main pattern feature 306. As seen in FIG. 3A, the main pattern feature 306 includes a portion attributable to the design feature 206A and a portion attributable to the enhancement feature 208A. Also included in the photomask 300 is a one-dimensional array 308 that includes multiple assist features like the assist feature 310. Because the photomask 300 is created according to the design layout 200, the spatial and geometric relationships between the individual mask features of the two-dimensional array 304 and the individual mask features of the one-dimensional array 308 are as described herein with respect to the design layout 200.

FIG. 3B presents a cross-sectional view of the portion of the photomask 300 illustrated in FIG. 3A. FIG. 3B presents a cross-section as seen according to the line A-A of FIG. 3A. Portions of the two-dimensional array 304 of main pattern features and the one-dimensional array 308 of assist features are shown. As illustrated, the main pattern feature 306 and the assist feature 310 are approximately the same height. In some embodiments, the main pattern features and the assist feature 310 may have different heights. For example, an assist feature may be formed in a directed deposition process after the formation of the main pattern features by an etching process.

Figure 4A:
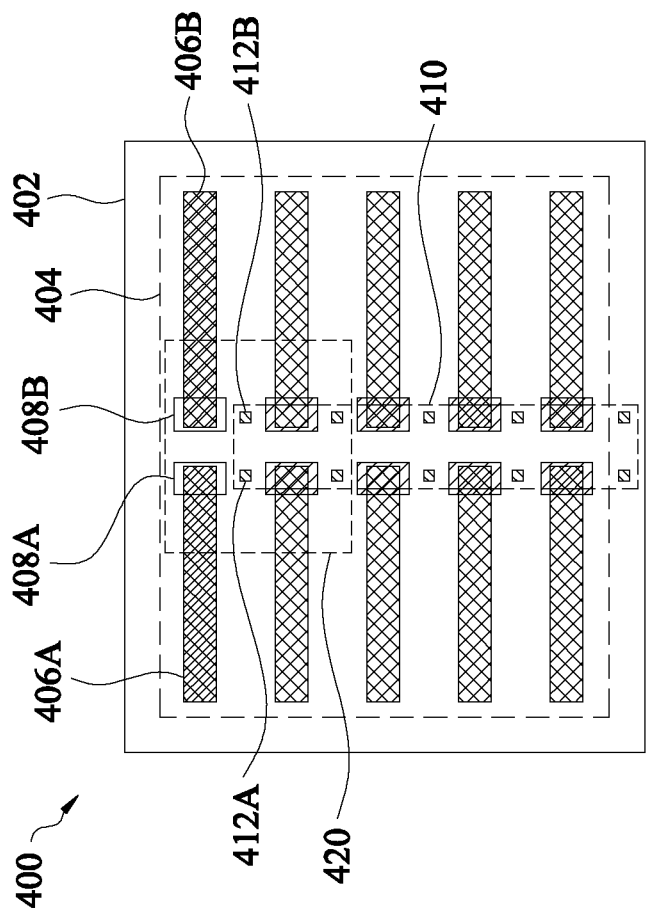
FIG. 4A is a top view of an embodiment of another semiconductor mask layout including a two-dimensional array of parallel mask features according to aspects of the present disclosure.
Figure 4B:
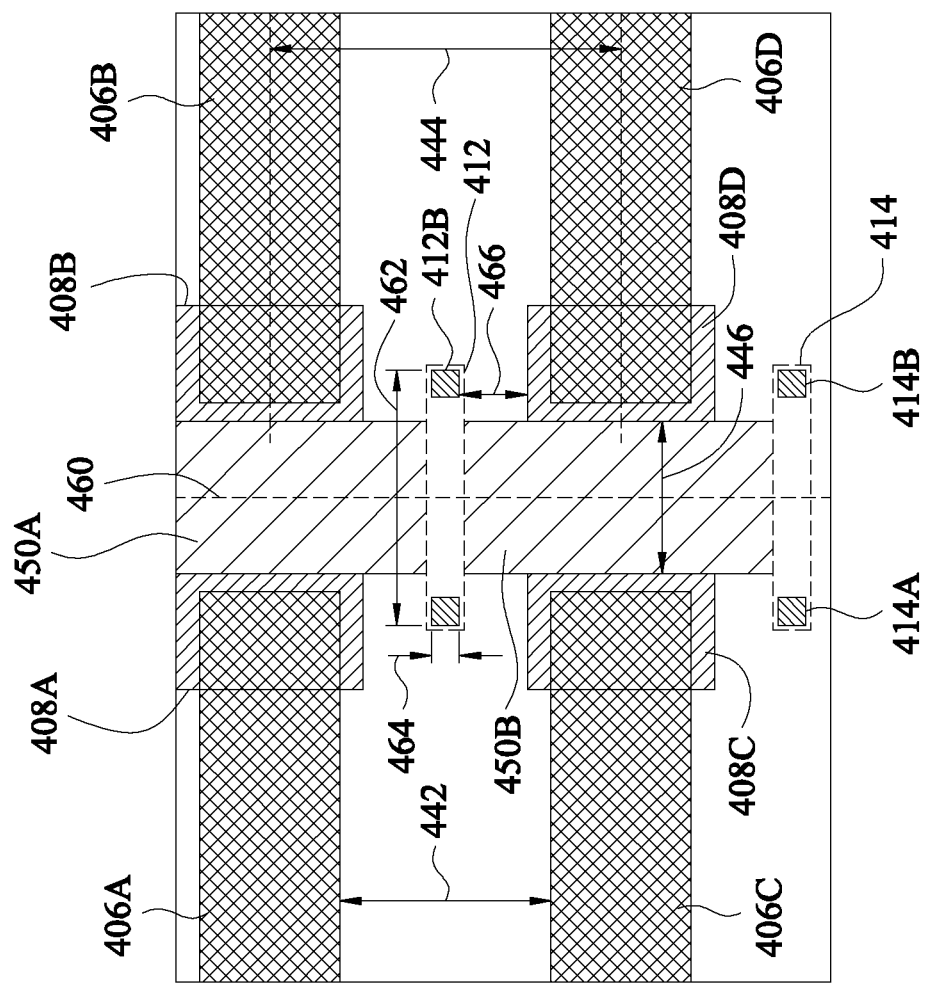
FIG. 4B is a close-up, top view of the semiconductor mask layout of FIG. 4A according to aspects of the present disclosure.

FIGS. 4A and 4B illustrate an alternative embodiment of the one-dimensional array 210. As illustrated, FIG. 4A shows a portion 402 of a design layout 400 that includes a two-dimensional array 404 of main pattern design features. An exemplary design feature 406A is shown as having an enhancement design feature 408A. The design feature 406A is paired with a design feature 406B such that they are aligned along a common longitudinal axis (not expressly shown). Between the design features 406A and 406B, an end-to-end region is formed.

FIG. 4A illustrates a one-dimensional array 410 of paired assist features, such as the exemplary paired assist features 412A and 412B. The one-dimensional array 410 includes pairs of rectangular assist features in an array that extends along the end-to-end regions formed by the pairs of main pattern design features, like features 206A and 206B. The one-dimensional array 410 is referred to as a one-dimensional array because the features 412A and 214B function cooperatively as a pair, and the pairs are repeated in the array. While the features 412A and 412B and the other individual assist features of the one-dimensional array 410 are to be included in any photomasks created according to the design layout 400, these features are not intended to be transferred into any resist layers patterned using such a mask. The one-dimensional array 410 may increase the fidelity of transfer of the main pattern design features, like the design features 406A and 406B of the two-dimensional array 404 into resist layers when a photomask patterned according to the design layout 400 is employed in photolithography.

FIG. 4B is a close-up, top view of the portion 420 shown in FIG. 4A. The portion 420 may present additional details regarding the one-dimensional array 410 and the individual assist features thereof. FIG. 4B illustrates main pattern design features 406A, 406B, 406C, and 406D. Portion 420 also illustrates line-end enhancement design features 408A, 408B, 408C, and 408D. As shown in FIG. 4B, the enhancement design features 408A-D may extend beyond the main pattern design features 406A-D. The design features 408A-D may be described in terms of a spacing value which describes the spacing 442 between the design features 206A and 206C (or between the design features 406B and 406D), or the spacing in the direction other than the pairing direction. A pitch value may be used to describe the pitch 444, i.e., mid-point to mid-point distance, between the design features 406A and 406C (or between the design features 406B and 406D). Also an end-to-end spacing value may describe an end-to-end spacing 446 between the enhancement design features 408C and 408D as shown, or in other embodiments, to describe the distance between the end of the design feature 406C and the design feature 406D, depending on the implementation of the enhancement design features 408A-D.

Also illustrated in the design layout 400 as seen in FIG. 4B, are two pairs of assist features. These two pairs of assist features include assist features 412A and 412B (collectively referred to as pair 412) and assist features 414A and 414B (collectively referred to as pair 414). Each of the pairs 412 and 414 borders and defines an end-to-end region. As shown in FIG. 4B, an end-to-end region 450A is defined by the enhancement design features 408A and 408B and by the pair 412. An end-to-end region 450B is defined by and bordered by the pair 412, the enhancement design feature 408C, the pair 414, and the enhancement design feature 408D. In embodiments, in which the enhancement design features 408A-D do not extend inward beyond the inside edges of the main pattern design features 406A-D, the design features 406A-D define and border the end-to-end regions 450A and 450B.

To convey spatial, geometric, and alignment relationships between some of the illustrated features of the design layout 400, an imaginary axis 460 is included. The imaginary axis 460 intersects all of the assist feature pairs, like pairs 412 and 414. As illustrated, the imaginary axis 460 bisects each of the assist feature pairs of the one-dimensional array 410, aligning them with the end-to-end regions 450A and 450B, which are also bisected by the imaginary axis 460. In some embodiments, the assist feature pairs of the array 410 may be offset, such that, while intersected by the imaginary axis 460, not all of the assist feature pairs of the array 410 are bisected.

The individual assist features of the array 410 may all have the same dimensions in some embodiments. In other embodiments, there may be variations among the pairs of assist features or among the individual assist features. As shown in FIG. 4B, the pair 412 includes a length 462, a width 464, and a spacing 466, which describes a separation distance between the assist feature 412B and the enhancement design feature 408D. In some embodiments, the spacing 466 may also describe the separation distance between the pair 412 and the enhancement design feature 408C and the separation distances between the pair 412 and the enhancement design features 408A and 408B. While the assist features 412A and 412B, and other assist features, may not be square in some embodiments, as illustrated they are square such that the width 464 of the pair 412 is also a length of each of individual assist features 412A and 412B. While the dimensions of the assist features in the one-dimensional array 210 may vary, in some embodiments, the width 464 may range from about 6 nanometers to about 20 nanometers, the length 462 may range from about 50 nanometers to about 240 nanometers, and the spacing 466 may range from about 40 nanometers to about 90 nanometers.

As described above in connection with FIG. 2B, the pairs 412 and 414 of the one-dimensional array 410 may improve the transfer of the desired pattern into photoresist layers during photolithography. The main pattern design features 406A-D and the other design features of the array 404 may have improved end-to-end distances and less tapering next to the end-to-end regions.

Figure 5:
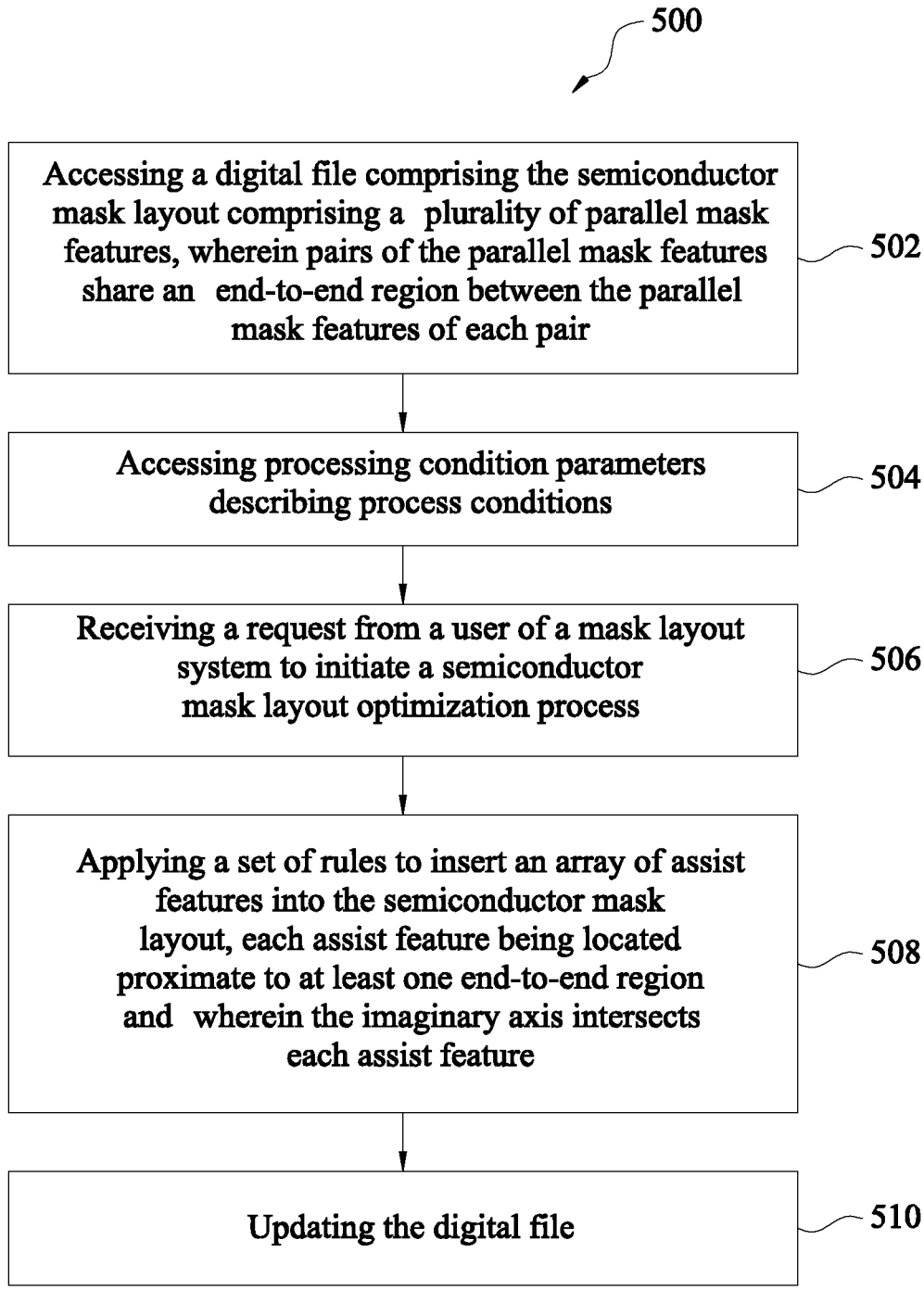
FIG. 5 is a flowchart illustrating an embodiment of a method optimizing a semiconductor mask layout according to aspects of the present disclosure.

Referring now to FIG. 5, a flowchart of a method 500 for improving the process window in parallel end-to-end regions is shown. As illustrated, the method 500 includes a plurality of steps or operations. Additional operations that are not shown may be included in some embodiments of the method 500. Such additional operations may be performed before, after, and/or in between the enumerated steps or operations without departing from the scope of the method 500. The method 500 may be performed by a design layout system 600 or by specific components thereof such as the processor 602, shown in FIG. 6. The design layout system 600 is discussed below in further detail.

Embodiments of the method 500 may begin in step 502 in which a processor accesses a digital file comprising a semiconductor mask layout. This may be done by loading the digital file and/or requesting the digital file from a server. The semiconductor mask layout comprises a plurality of parallel mask features, in which pairs of the parallel mask features share an end-to-end region between the parallel mask features of each pair. Such a semiconductor mask layout may be the design layout 200 or the design layout 400. In an embodiment in which the design layout 200 is included in the digital file, the digital file includes the two-dimensional array 210 as described herein. In some embodiments, the design layout 200 may include enhancement design features like the enhancement design features 208A and 208B. In other embodiments, the process may add the enhancement design features to the two-dimensional array 210.

In step 504, the processor accesses processing condition parameters that describe process conditions. These process conditions may include: the material layer to be patterned by the photomask based on the semiconductor mask layout, the process (e.g., wet etch, dry etch, physical and/or chemical etch mechanisms used) use to pattern the material layer, the wavelength of the light source (e.g., ultraviolet, extreme ultraviolet, etc.), the type of light source or illumination pattern (e.g., dipole, annular, circular, etc.), and/or pattern geometries including the pitch, the end-to-end spacing, and the spacing between the parallel design features. The processor may derive at least some of these process conditions from information contained in the data file including the semiconductor mask layout. The processor may derive other conditions by requesting them from one or more connected servers that include such process information. For example, the processor may request and receive characterization data that includes measurement data from many photomasks produced according to the semiconductor mask layout. The measurement data may include the pitch, the end-to-end spacing, etc., as described herein.

In step 506, the processor may receive a request from a user of the design layout system to initiate a semiconductor mask layout optimization process. In some embodiments, enhancement design features like the enhancement design features 208A and 208B may be added by the processor as part of step 506. The request may be received by the user by checking one or more preferences or settings entered by the user before the digital file is accessed. The checking of preferences and settings may be performed when the digital file is accessed or afterwards.

In step 508, the processor applies a set of rules to insert an array of assist features into the semiconductor mask layout, each assist feature being located proximate to at least one end-to-end region. In the context of the design layout 200, the one-dimensional array 210 of assist features may be inserted by the processor. The processor may use the geometry of the two-dimensional array 204 in order to size and position each of the assist features in the one-dimensional array 210. For example, a width of the one of the assist features may range from about 6 nanometers to about 20 nanometers, a length thereof may range from about 50 nanometers to about 200 nanometers, and a spacing thereof may range from about 40 nanometers to about 90 nanometers.

The processor may check or verify whether certain conditions are met before the set of rules is applied to generate and insert that array of assist features. For example, the processor may check that the light source used is a dipole light source. Additionally, the processor may check that the minimum pitch is less than about 88 or 90 nanometers, that width of the end-to-end regions is less than about 45 nanometers, and that the spacing between one pair of main pattern features and another pair of main pattern features is in a range of about 40 to about 80 nanometers. These measurements may be based solely on the semiconductor mask layout or may also incorporate measurements of developed masks obtained in after-development inspections. In some embodiments, the processor may check the geometries of the two-dimensional array in terms of the wavelength of light to be used in transferring the semiconductor mask layout, as implemented in a photomask, into a photoresist layer.

At step 510, after inserting the array of assist features into the semiconductor mask layout, the processor may update the digital file. This may be done by saving the digital file or by creating a new digital file that includes the array of assist features. When inserting the array of assist features, the array of assist features may be inserted into a layer other than the layer having the plurality of parallel mask features. In this manner, the method 500 may be performed to include the array of assist features into a two-dimensional array of main pattern features.

Figure 6:
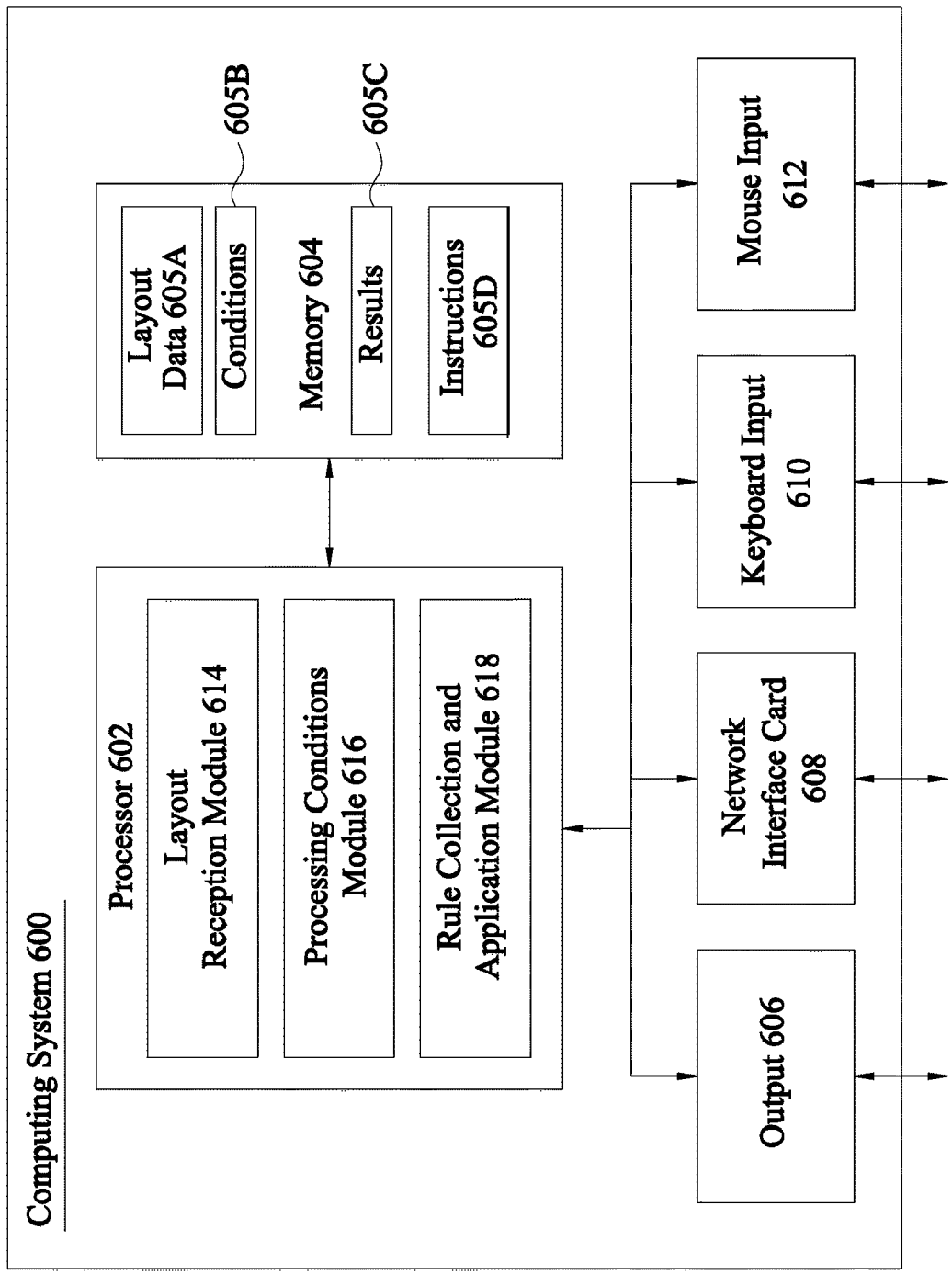
FIG. 6 is a diagram of a computing system to optimize a semiconductor mask layout according to aspects of the present disclosure.

Referring now to FIG. 6, shown therein is a design layout system 600 that may be used to perform the method 500 of FIG. 5. As illustrated, the system 600 includes a processor 602, which may be one or more processors, in communication with a memory 604 such that it is configured to store information in and retrieve information from memory 604. Memory 604 is a tangible, non-transient computer-readable medium. Embodiments of the memory 604 may include, without limitation, RAM or ROM, hard drives, floppy disks, flash memory, or a CD-ROM, etc. The memory 604 may include layout data 605A from the digital file, conditions and associated parameters 605B, a set of rules 605C, and instructions 605D or executable code that, when executed by the processor 602, causes the system 600 to perform the operations described above in connection with the method 500 of FIG. 5. A plurality of input/output mechanisms is provided in the system 600, including an output 606, which may communicate with a display to convey visual information to a user or operator. System 600 includes a network interface card 608 that allows the system 600 to communicate with remote computing and information storage systems and servers. System 600 also includes a keyboard input 610 and a mouse input 612 that allow the operator to interact with the system to enter information and select options. Other inputs and outputs may be included in other embodiments of the system 600.

The processor 602, which may be one or more processors or processing cores, provides a plurality of modules that facilitate the simulation of semiconductor processes, include a layout reception module 14, a processing conditions module 616, and a rule collection and application module 618 (also referred to herein as a rule module 618). Some embodiments of the system 600 may include additional modules. The modules may be provided by the computer processor 602 executing computer-readable instructions stored in the memory 604. In some embodiments, some of the modules are implemented as dedicated hardware devices, while in others, combinations of hardware and software are used to provide the modules.

The layout reception module 614 receives a desired semiconductor mask layout as a digital file, such as a layer or layers in a GDSII file or other comparable file. The processing conditions module 616 may retrieve process condition parameters from a number of sources. For example, the processing conditions module 616 may collect geometries of the various features of the desired semiconductor mask layout in the digital file. The geometries may include a pitch, an end-to-end spacing, and a separation distance between pairs of parallel design features as described herein. The processing conditions module 616 may also receive one or more processor recipes for processes to be performed using a photomask created from the semiconductor mask layout. The processing conditions may also communicate with other resources in a semiconductor fab. For example, the processing conditions module 616 may identify a type of lighting source (e.g., circular, annular, dipole, etc.) from a lighting source type indicator, which may be present in the digital file. Additionally, the processing conditions module 616 may check to see that certain conditions are satisfied before a set of rules may be applied to insert a one-dimensional array of assist features.

If the conditions are satisfied, the rule module 618 may receive information from the processing conditions module 616, such as relevant geometries of the semiconductor mask layout. Alternatively, such information may be obtained by the rule module 618 directly from the layout reception module 614. The rule module 618 may apply the rules described herein to insert a one-dimensional array of assist features into the semiconductor mask layout. These assist features may improve the process window of the end-to-end regions present in the semiconductor mask layout.

Thus, embodiments of a photomask, a method of improving the process window of end-to-end regions of the photomask, and a design layout system for inserting a one-dimensional array of assist features are described herein. An embodiment of the photo mask may include substrate that is at least partially transparent to a source of illumination and a masking material layer over the substrate. The masking material layer includes a plurality of patterned mask features including a two-dimensional array of parallel mask features and a one-dimensional array of assist features. The pairs of the parallel mask features share an end-to-end region between the parallel mask features of each pair and at least one of the assist features is located proximate to and borders at least one end-to-end region.

In some embodiments, an imaginary axis bisects the array of assist features, and in some other embodiments at least one of the assist features is a rectangular assist feature, the rectangular assist feature being bisected by the imaginary axis. A width of the one of the assist features may be in a first range from about 6 nanometers to about 20 nanometers, a length of the one of the assist features may be in a second range from about 50 nanometers to about 200 nanometers, and a spacing between the one of the assist features and a nearest patterned mask feature may be in a third range from about 40 nanometers to about 90 nanometers. At least one of the assist features is equally proximate to two end-to-end regions in some embodiments. In some embodiments, the array of one-dimensional features may include pairs of individual assist features. A pitch of the two-dimensional array of parallel mask features may be less than about 90 nanometers. In some embodiments, the pitch of the two-dimensional array may be larger than or equal to the minimum pitch.

In an embodiment of the method, the method includes steps of accessing a digital file including the semiconductor mask layout. The semiconductor mask layout includes a plurality of parallel mask features, wherein pairs of the parallel mask features share an end-to-end region between the parallel mask features of each pair. An imaginary axis may bisect the end-to-end regions. The method may further include steps of accessing processing condition parameters describing process conditions, receiving a request from a user of a mask layout system to initiate a semiconductor mask layout optimization process, and applying a set of rules to insert an array of assist features in the pairs of the parallel mask features of the semiconductor mask layout. Each assist feature may be located proximate to and bordering at least one end-to-end region. The imaginary axis intersects each assist feature in the array. Further, the method may include a step of updating the digital file.

In some embodiments, the process conditions may include a light source type indicator, a light source wavelength, a pitch value, an end-to-end spacing value, and a parallel mask feature separation value, wherein the end-to-end spacing values and the parallel mask feature separation values are after-development-inspection values. In some embodiments, the end-to-end spacing value is less than about 0.23 times the light source wavelength and the parallel mask feature separation value is in a range from about 0.21 times the light source wavelength to about 0.41 times the light source wavelength. The set of rules may include dimension ranges for the array of assist features such that the mask layout system inserts the array of assist features that comply with the dimension ranges. The dimension ranges for the array of assist features may include a width, a length, and spacing for each assist feature. The width may be in a first range from about 6 nanometers to about 20 nanometers, the length may be in a second range from about 50 nanometers to about 200 nanometers, and the spacing may be in a third range from about 40 nanometers to about 90 nanometers. Updating the file may include generating a new digital file that comprises the plurality of parallel mask features and the array of assist features.

Another embodiment is a non-transitory computer-readable medium having instructions for the method described above. Additional embodiments may include a design layout system that includes such a computer-readable medium and is configured to execute the instructions to perform the method described above.

The various embodiments of the present disclosure may improve the end-to-end process window, particularly as the node size of the semiconductor fabrication process goes below 16 nanometers. The embodiments of the present disclosure may be or may enable faster performance that more computationally intensive, model-based assist feature creation and also may avoid printing problems that such model-based assist feature creation may entail.

What is claimed is:

1. A photomask comprising:
  a substrate that is transparent to a source of illumination; and
  a masking material layer over the substrate, the masking material layer comprising a plurality of patterned mask features, the plurality of patterned mask features comprising:
    a two-dimensional array of parallel mask features, wherein pairs of the parallel mask features share an end-to-end region between the parallel mask features of each pair and wherein an imaginary axis bisects the end-to-end regions; and
    a one-dimensional array of assist features, each assist feature being a sub-resolution feature and located proximate to at least one end-to-end region, wherein the imaginary axis intersects each assist feature, and wherein one of the assist features enhances line end resolution of four of the parallel mask features.

2. The photomask of claim 1, wherein the imaginary axis bisects the array of assist features.

3. The photomask of claim 1, wherein at least one of the assist features is a rectangular assist feature, the rectangular assist feature being bisected by the imaginary axis.

4. The photomask of claim 3, wherein a width of the one of the assist features is in a first range from about 6 nanometers to about 20 nanometers, a length of the one of the assist features is in a second range from about 50 nanometers to about 200 nanometers, and a spacing between the one of the assist features and a nearest patterned mask feature is in a third range from about 40 nanometers to about 90 nanometers.

5. The photomask of claim 1, wherein at least one of the assist features is equally proximate to two end-to-end regions.

6. The photomask of claim 1, wherein at least one of the assist features comprises paired assist features.

7. The photomask of claim 1, wherein a minimum pitch of the two-dimensional array of parallel mask features is less than about 88 nanometers.

8. A method of optimizing a semiconductor mask layout, the method comprising:
   accessing a digital file comprising the semiconductor mask layout, the semiconductor mask layout comprising a plurality of parallel mask features, wherein pairs of the parallel mask features share an end-to-end region between the parallel mask features of each pair, with an imaginary axis bisecting the end-to-end regions; and
   applying a set of rules to insert an array of assist features into the semiconductor mask layout, each assist feature being a sub-resolution feature and located proximate to at least one end-to-end region, wherein the imaginary axis intersects each assist feature, and wherein at least one of the assist features is equally proximate to two end-to-end regions.

9. The method of claim 8, wherein the applying of the set of rules is performed on condition that a dipole light source is to be used for performing a lithography process with the semiconductor mask layout.

10. The method of claim 8, wherein the applying of the set of rules is performed on condition that a parallel mask feature end-to-end spacing value is less than about 0.23 times a light source wavelength to be used in a lithography process with the semiconductor mask layout and a parallel mask feature separation value is in a range from about 0.21 times the light source wavelength to about 0.41 times the light source wavelength.

11. The method of claim 8, wherein the set of rules comprises dimension ranges for the array of assist features.

12. The method of claim 11, wherein the dimension ranges for the array of assist features comprise a width, a length, and spacing for each assist feature, and wherein the width is in a first range from about 6 nanometers to about 20 nanometers, the length is in a second range from about 50 nanometers to about 200 nanometers, and the spacing is in a third range from about 40 nanometers to about 90 nanometers.

13. The method of claim 8, further comprising generating a new digital file that comprises the plurality of parallel mask features and the array of assist features.

14. The method of claim 8, wherein the array of assist features is a one-dimensional array.

15. A non-transitory computer-readable medium, the non-transitory computer-readable medium comprising instructions that, when executed by a processor, cause the processor to perform operations comprising:
   accessing a digital file comprising a semiconductor mask layout, the semiconductor mask layout comprising a plurality of parallel mask features, wherein pairs of the parallel mask features share an end-to-end region between the parallel mask features of each pair, with an imaginary axis bisecting the end-to-end regions; and
   applying a set of rules to insert an array of assist features into the semiconductor mask layout, each assist feature being a sub-resolution feature and located proximate to at least one end-to-end region, wherein the imaginary axis intersects each assist feature, and wherein at least one of the assist features is equally proximate to two end-to-end regions.

16. The non-transitory computer-readable medium of claim 15, wherein the applying of the set of rules is performed on condition that a parallel mask feature end-to-end spacing value is less than about 0.23 times a light source wavelength to be used in a lithography process with the semiconductor mask layout and that a parallel mask feature separation value is in a range from about 0.21 times the light source wavelength to about 0.41 times the light source wavelength.

17. The non-transitory computer-readable medium of claim 15, wherein the set of rules comprises dimension ranges for the array of assist features, and wherein the dimension ranges for the array of assist features comprise a width, a length, and spacing for each assist feature, and wherein the width is in a first range from about 6 nanometers to about 20 nanometers, the length is in a second range from about 50 nanometers to about 200 nanometers, and the spacing is in a third range from about 40 nanometers to about 90 nanometers.

18. The non-transitory computer-readable medium of claim 15, wherein at least one of the assist features is a rectangular assist feature, the rectangular assist feature being bisected by the imaginary axis.

19. The non-transitory computer-readable medium of claim 15, wherein the applying of the set of rules is performed on condition that a dipole light source is to be used for performing a lithography process with the semiconductor mask layout.

20. The non-transitory computer-readable medium of claim 15, wherein one of the assist features enhances line end resolution of four of the parallel mask features.

* * * * *